(12) United States Patent
Yeap et al.

(10) Patent No.: US 6,503,814 B2
(45) Date of Patent: Jan. 7, 2003

(54) METHOD FOR FORMING TRENCH ISOLATION

(75) Inventors: Choh-Fei Yeap, Austin, TX (US); Jian Chen, Austin, TX (US); Franklin D. Nkansah, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 36 days.

(21) Appl. No.: 09/765,740

(22) Filed: Jan. 19, 2001

(65) Prior Publication Data

US 2002/0098660 A1 Jul. 25, 2002

(51) Int. Cl.$^7$ ................................................. H01L 21/76
(52) U.S. Cl. ........................ 438/433; 438/223; 438/424; 438/524
(58) Field of Search ................................ 438/433, 223, 438/424, 524

(56) References Cited

U.S. PATENT DOCUMENTS 5,989,978 A * 11/1999 Peidous

* cited by examiner

Primary Examiner—John F. Niebling
Assistant Examiner—Stanetta Isaac
(74) Attorney, Agent, or Firm—James L. Clingan, Jr.; Kim-Marie Vo

(57) ABSTRACT

The semiconductor device has a trench isolation between a P-well and N-well. This trench isolation region is formed of oxide which during the course of the formation of the P and N well is doped with P-type and N-type dopants. Thus the trench has a P-type doped region and an N-type doped region which are typically phosphorous and boron. After the P and N well are formed, a rapid thermal anneal is applied to the device structure. This has the effect of causing the phosphorous doped and boron doped portions of the trench oxide to be etched at substantially the same rate. After this RTA step, gate oxide is formed over the P and N well. The following formation of polysilicon gates results in a relatively flat gate over transistor structure. This avoids corner leakage which is a problem with trench isolation.

15 Claims, 3 Drawing Sheets

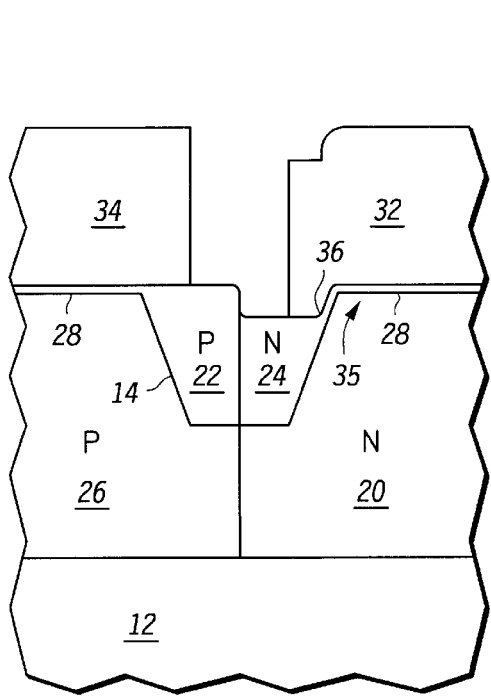
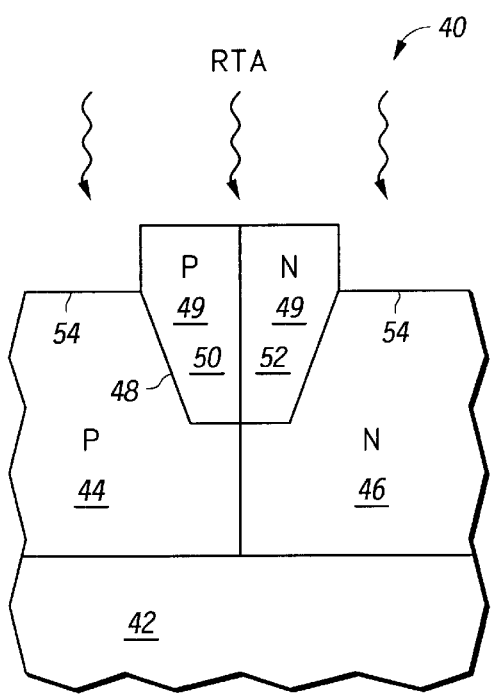
FIG.5
—PRIOR ART—
FIG.6
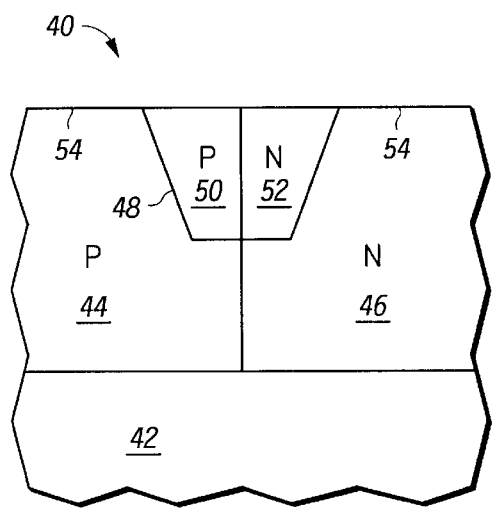
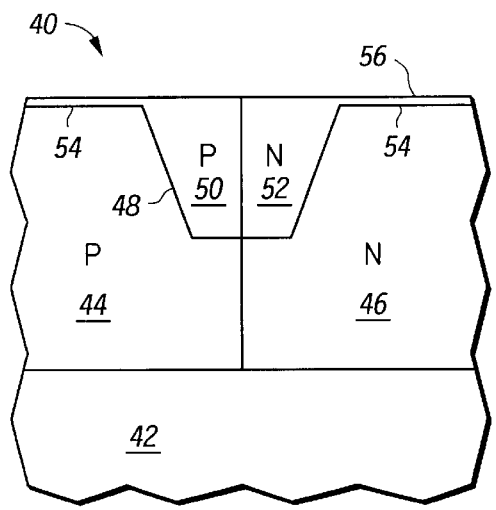
FIG.7
FIG.8

METHOD FOR FORMING TRENCH ISOLATION

FIELD OF THE INVENTION

The invention relates to manufacturing semiconductors, and more specifically to forming trench isolation for use in semiconductor device.

BACKGROUND OF THE INVENTION

One of the objections in forming transistors is to minimize the leakage that occurs when the transistor is in a non-conductive state. This is important for many applications, especially ones requiring a battery. Common operation of circuits using batteries are for cell phones, pagers and personal digital assistants. There are a very large number of transistors on a typical integrated circuit that is utilized by one of these devices. Even millions of transistors may be required in providing the functions required for such devices. Thus, a very tiny amount of leakage by each transistor can result in significant current drain which has the effect of draining the battery and requiring more frequent recharging of the battery.

One of the problems that transistors have commonly is leakage at the corners, the corner where the isolation and the edge of the gate intersect. This arises most typically because of the rounding of trench isolation. The trench isolation is more etched at boundary between an active region, where the transistor is formed, and the trench isolation. This rounding results in a source of leakage.

In describing this particular problem, reference is made to prior art FIG. 1, that shows a device 10 comprising a substrate 12, a trench isolation region 14 and a photoresist mask 16. Substrate 12 has a semiconductor material such as silicon at least at the surface. Trench 14 is typically silicon oxide so that photoresist 16 is used as a mask for an implant to form an N-well, so photoresist mask 16 has one boundary over trench 14. The N-type material is typically phosphorus but may be some other material such as arsenic. Another possibility is that it be a combination of two types of N-type material such as arsenic and phosphorus. In such a combination, the phosphorus is typically the deeper of the two.

Shown in FIG. 2 is an analogous operation for forming a P-well. Device has a photoresist region 18 overlying N-well 20 which was formed as a result of the implant shown in FIG. 1. Shown in FIG. 2 is a P-type implant to form a P-well. The result of this implant is shown in FIG. 3. The trench region 14 is shown as having two doped regions 22 and 24 and P-well 26 along with previously formed N-well. The P-type doping is typically boron, and with the N-type doping being typically phosphorous, a portion of trench 14 is phosphorous doped and a portion is boron doped. Trench region 14 does extend above a surface 28 of substrate 10. This arises because of the nitride which is used as a mask for forming the trench. After trench 14 is etched out of substrate 12, there is a subsequent oxide fill of the trench, a CMP process to planarize, and a subsequent removal of the nitride. Thus, the resulting trench fill protrudes above surface 28.

This protruding region must be reduced and desirably result in a level which is the same as that of surface 28. After such an etch to reduce the protrusion, the result is shown in FIG. 4. The result is that region 24 is lower than boron doped region 22. This is an undesirable result of the phosphorous-doped oxide. In this case, region 24 etches faster than the boron-doped oxide of region 22. After etching trench region 14, an oxide layer 30 is formed on surface 28 of substrate 12. After oxide layer 30 has been formed, polysilicon is deposited and selectively removed to leave polysilicon region 32 over N-well 20 and polysilicon region 34 over P-well 26. Polysilicon region 32 extends over trench 14 and more specifically, phosphorous-doped region 24. Similarly, polysilicon region 34 extends over trench region 14 and particularly over boron doped region 22. The resulting structure shown in FIG. 5 demonstrates the typical problem where leakage occurs.

A region 36 is at an interface between surface 28 and trench region 14. At this interface 36, there is a portion of trench 14 which is recessed downward. This recessed downward area is a corner of a transistor of which polysilicon region 32 is a gate. It is in this region 36 where leakage is a primary problem. Notice that the gate, which is formed from polysilicon region 32, extends downward into trench 14. This is an area which is different than the other portion of the transistor. This FIG. 5 cross section shows a channel region 35 between a source and a drain that are not shown in this cross section. The source and drain would be in a cross section taken orthogonal to this cross section. The current drain path that is problematic is through a region such as region 36, which typically occurs, between the source and drain. Another problem that relates to undesirable leakage is diode leakage between the source/drain regions and the well region. There is thus a need to reduce current leakage which arises as a result of region such as region 36 and diode leakage.

BRIEF DESCRIPTION OF THE DRAWINGS

The present invention is illustrated by way of example and not limitation in the accompanying figures, in which like references indicate similar elements, and in which:

FIG. 5 is a cross section of a device structure according to the prior art at a subsequent step in processing to that shown in FIG. 4;

FIG. 6 is a cross section of a device structure taken after the process step shown in FIG. 3 according to a preferred embodiment of the invention;

FIG. 7 is a cross section of a device structure at a subsequent step in processing to that shown in FIG. 6;

FIG. 8 is a cross section of a device structure at a subsequent step in processing to that shown in FIG. 7.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

A device structure utilizing a rapid thermal anneal (RTA) step results in the benefit of low current leakage, low diode leakage between source and drain, and an improved gate dielectric. This rapid thermal anneal step is performed after well formation but prior to gate oxide. This rapid thermal anneal has the effect of substantially equalizing the etch rates of P-doped and N-doped oxide, more particularly, boron-doped oxide and phosphorous doped oxide.

Figure 1:
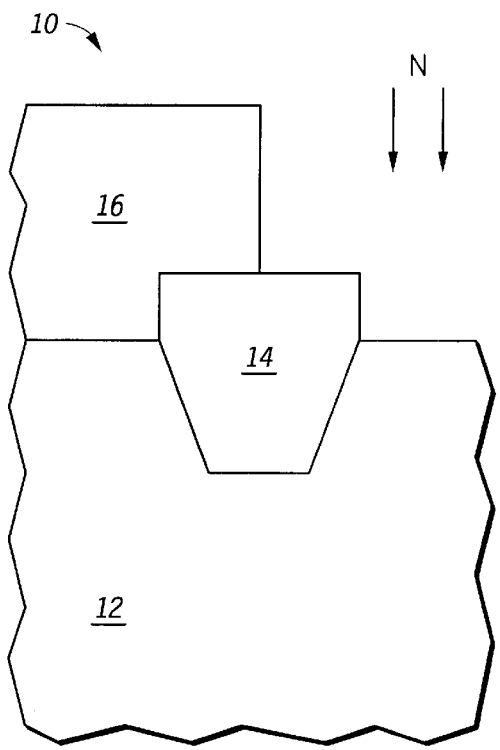
FIG. 1 is a cross section of a device structure according to the prior art.
Figure 2:
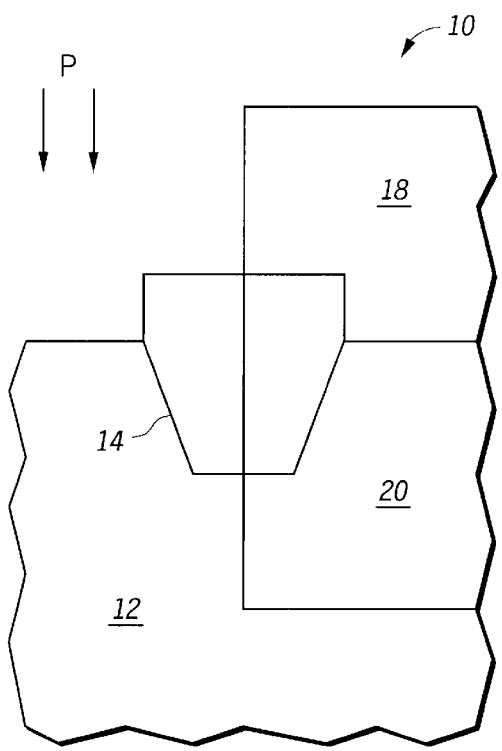
FIG. 2 is a cross section of a device structure according to the prior art at a subsequent step in processing to that shown in FIG. 1.
Figure 3:
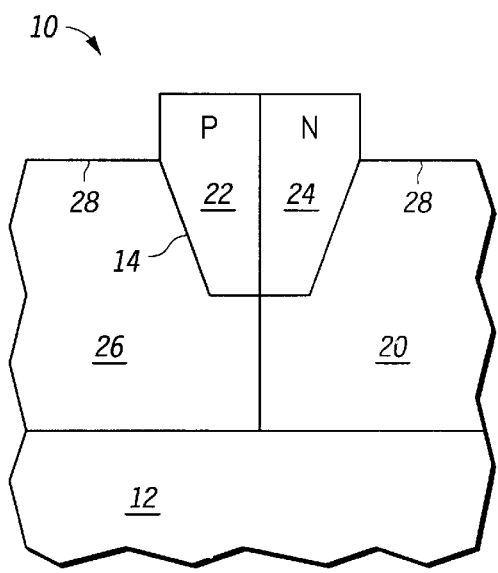
FIG. 3 is a cross section of a device structure according to the prior art at a subsequent step in processing to that shown in FIG. 2.
Figure 4:
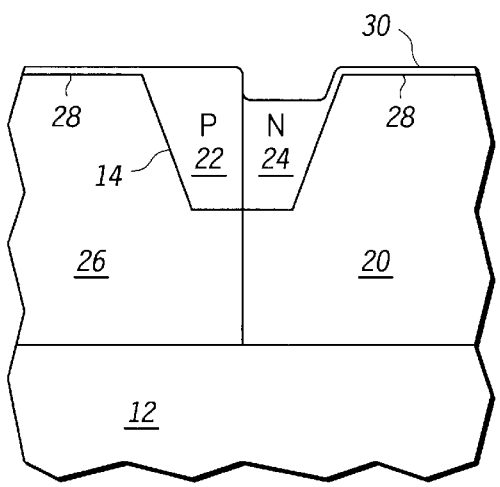
FIG. 4 is a cross section of a device structure according to the prior art at a subsequent step in processing to that shown in FIG. 3.

Shown in FIG. 6 is a device structure 40 at a processing step subsequent to that of analogous structure 10 of FIG. 3. Structure 40 comprises a substrate 42, a P-well 44, an N-well 46, a trench region 48 with a trench dielectric 49, a P-doped portion 50 of trench 48 and an N-doped portion 52 of trench 48 which comprise trench dielectric 49. Substrate 42 has a surface 54 and trench dielectric 49 both of which receive an RTA for approximately 10 seconds at a temperature of about 1000°. The beneficial result of this RTA step is that N-doped region 52 and P-doped region 50 then have substantially the same etch rate. In this described embodiment, N-doped region 52 is phosphorous doped, and P-doped region 50 is boron.

After a subsequent etch to remove an elevated portion of trench dielectric 49, the result is shown in FIG. 7. As shown in FIG. 7, device structure 40 has trench region 48 with a surface level with surface 54 of substrate 42. This is a very desirable result. This observable characteristic may be explained as the crystalline structure of N-doped region 52 being healed as a result of the RTA. The RTA having the effect of improving the quality of the N-doped region 52 as well as surface 56. P-doped region 50 may not have as much healing required so that the degree of improvement in the quality of the oxide of region 50 is not nearly as great as that of region 52. In any event, the net effect is a significant reduction in the etch rate of phosphorous-doped region 52 in relation to the etch rate of boron-doped region 50. This allows for the etching of trench region 48 being etched back at a substantially even rate across its surface. The next step is to form a gate oxide 56 over surface 54 and trench region 48. The result is a substantially flat surface for oxide 56.

Figure 9:
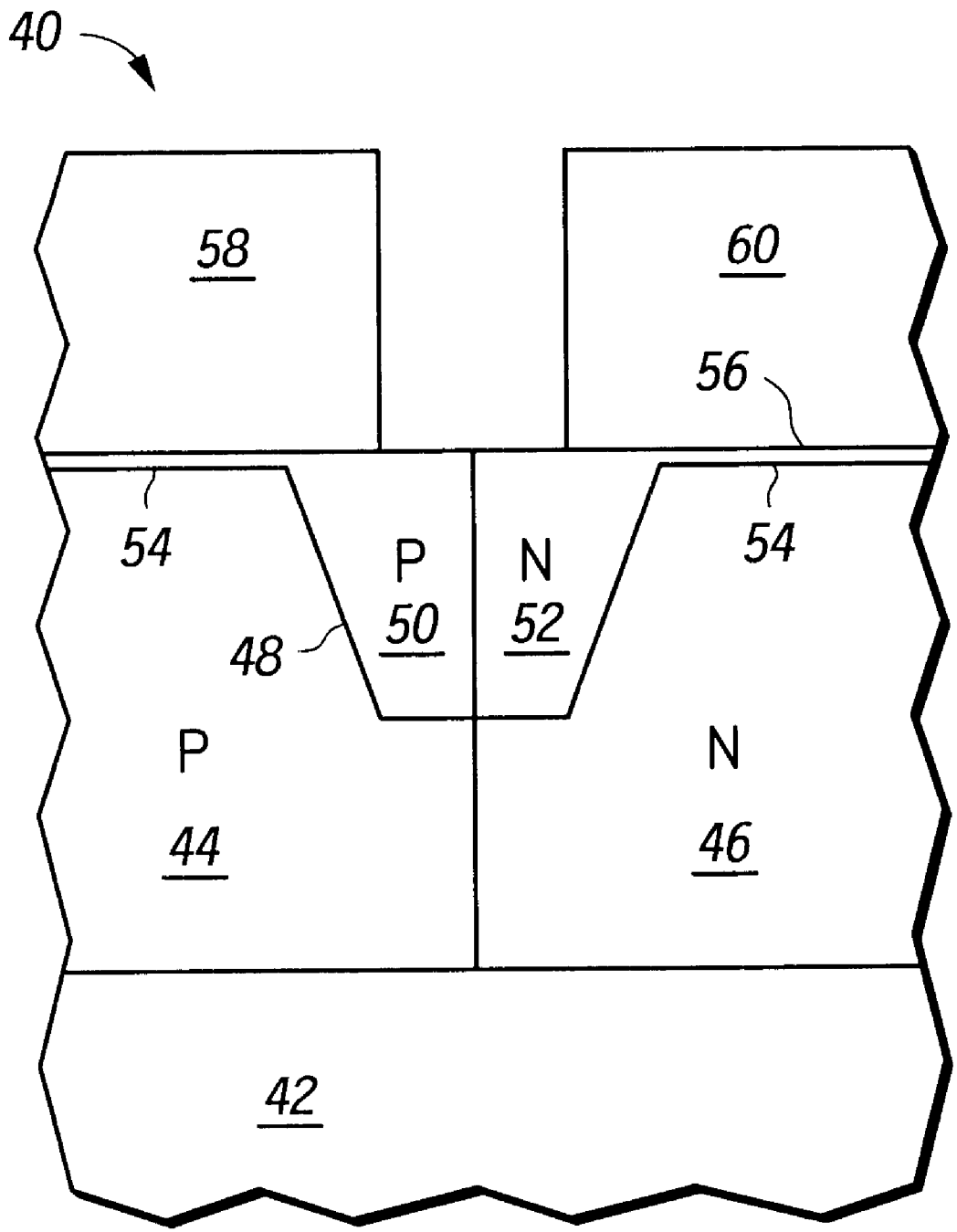
FIG. 9 is a cross section of a device structure at a subsequent step in processing to that shown in FIG. 8.

The next step is to deposit polysilicon and etch it to form gates. This is shown in FIG. 9 as polysilicon gates 58 and 60. Polysilicon gate 60 is over N-well 46 and polysilicon gate 58 is over P-well 44. Polysilicon gate 60 extends over trench 44 in the area of phosphorus doped region 52. In this case, however, the extension of gate 60 does not drop below surface 54. Thus, there is no corner that creates the leakage problem. So one significant benefit of the process of using the RTA step after well formation and before gate oxide formation is the reduction in leakage at the transistor corner.

Another observed benefit is reduced diode leakage from the source/drain to well. The RTA may also has the effect of improving the quality of the crystalline structure of the silicon at surface 54. The well implant itself may cause some reduction in the quality of the crystalline structure. The RTA may assist in improving the quality of that structure. The benefit that arises from this improved silicon structure at surface 54 is improved gate dielectric, which is typically oxide, formation.

In this particular embodiment the RTA is performed for approximately 10 seconds at about 1000°. Other temperatures and times may also be effective. The temperature should be high enough to obtain the desired benefits. For example, 900° C. has been found to be insufficient to achieve the maximum benefit. If too high of a temperature is used, it will cause the dopants to move more than is desirable, changing the doping profile. And if the time of the RTA is extended, the same result of adversely changing the doping profile can occur. The maximum temperature should not exceed 1150° to avoid adversely affecting the doping profile and the time duration of the high constant temperature of the RTA should not exceed 30 seconds and not be less than 5 seconds. In general the preferred time is between about 10 and 20 seconds. The RTA is typically ramped up at a rate of between 75 and 100° per second to the desired high constant temperature. In the alternative, there may be other techniques than RTA for achieving the same high temperature for a short duration.

The gas ambient of the RTA can also be important. Nitrogen, argon, or another inert gas can provide more desirable effects than is provided by an oxygen ambient. The use of an oxygen ambient may result in the undesirable effect of thickening the gate oxide. Thus, the RTA in the presence of inert gas ambient provides a benefit.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure comprising:
   providing a substrate having a top surface;
   forming a trench within the substrate;
   forming a first dielectric material within the trench and above the top surface of the substrate over the trench;
   implanting a first dopant within a first portion of the first dielectric material;
   implanting a second dopant within a second portion of the first dielectric material;
   annealing the first dielectric material after implanting the first dopant and the second dopant;
   removing a third portion of the first dielectric after annealing, wherein the third portion is above the top surface and comprises portions of the first and second portions; and
   forming a gate dielectric after removing the third portion of the first dielectric.

2. The method of claim 1, wherein annealing the first dielectric material is a rapid thermal anneal.

3. The method of claim 2, wherein the rapid thermal anneal is performed for not more than approximately 10 seconds at a constant temperature in the presence of an inert gas ambient.

4. The method of claim 3, wherein the constant temperature is approximately 1000 degrees Celsius.

5. The method of claim 2, wherein the rapid thermal anneal has a ramp rate of approximately 75 degrees Celsius per second.

6. The method of claim 1, wherein the first dielectric material is an oxide.

7. The method of claim 1, wherein the first dopant is phosphorus.

8. The method of claim 1, wherein the second dopant is boron.

9. A method of forming a semiconductor structure comprising:

providing a substrate having a top surface;

forming a dielectric material within the substrate and above the top surface of the substrate;

doping a first portion of the dielectric material with a first dopant;

doping a second portion of the dielectric material, disposed laterally adjacent to the first portion, with a second dopant;

annealing the dielectric material after doping the first portion and the second portion of the dielectric material;

removing a third portion of the first dielectric after annealing, wherein the third portion is above the top surface and comprises portions of the first and second portions; and forming a gate dielectric after removing the third portion of the first dielectric.

10. The method of claim 9, wherein annealing the dielectric material is further defined as a rapid thermal anneal.

11. The method of claim 10, wherein annealing is performed for 5–20 seconds at a constant temperature.

12. The method of claim 11, wherein annealing is performed for 10 seconds at a constant temperature.

13. The method of claim 11, wherein the constant temperature is between 900 to 1150 degrees Celsius.

14. The method of claim 13, wherein the constant temperature is 1000 degrees Celsius.

15. A method of forming a semiconductor structure comprising:

providing a substrate having a top surface;

forming a dielectric material within the substrate and above the top surface of the substrate;

doping a first portion of the dielectric material with a first dopant;

doping a second portion of the dielectric material, disposed laterally adjacent to the first portion, with a second dopant;

annealing the dielectric material after doping the first portion and the second portion of the dielectric material to cause the first and second portions to have substantially equal etch rates;

etching a third portion of the first dielectric after annealing, wherein the third portion comprises portions of the first and second portions; and forming a gate dielectric after removing the third portion of the first dielectric.

* * * * *